United States Patent [19]

Li

[11] 3,765,956

[45] Oct. 16, 1973

[54] SOLID-STATE DEVICE

[76] Inventor: Chou H. Li, 379 Elm Dr., Roslyn, N.Y. 11576

[22] Filed: Oct. 19, 1971

[21] Appl. No.: 190,483

Related U.S. Application Data

[63] Continuation-in-part of Ser. Nos. 868,129, Oct. 21, 1969, abandoned, and Ser. No. 802,018, Feb. 25, 1969, Pat. No. 3,500,135.

[52] U.S. Cl. .................... 148/33, 148/1.5, 148/1.6, 148/172, 317/234 R

[51] Int. Cl. .................... H01l 3/16

[58] Field of Search .................... 75/135; 148/1.5, 148/33, 172, 1.6, 186; 317/234

[56] References Cited

UNITED STATES PATENTS

| | | | |
|---|---|---|---|
| 2,788,298 | 4/1957 | Clarke | 148/1.5 |
| 2,813,048 | 11/1957 | Pfann | 148/1.5 X |
| 2,815,304 | 12/1957 | Gudmundsen | 148/1.5 |
| 2,899,343 | 8/1959 | Statz | 148/1.5 |
| 2,973,290 | 2/1961 | Mlausky | 148/1.5 |
| 3,124,452 | 3/1964 | Kraft | 75/135 |
| 3,132,057 | 5/1964 | Greenberg | 148/33 |
| 3,150,017 | 9/1964 | Ezaki | 148/172 |
| 3,226,225 | 12/1965 | Weiss et al. | 75/134 |
| 3,267,405 | 8/1966 | Weiss et al. | 75/135 X |
| 3,278,342 | 10/1966 | John et al. | 148/1.6 |

*Primary Examiner*—L. Dewayne Rutledge
*Assistant Examiner*—J. M. Davis

[57] ABSTRACT

The ultra-miniaturized, active solid-state devices and circuitries have unique material bodies having signal-translating regions attached thereto for active signal translation. These regions, comprising melt-grown, or simulated melt-grown, metallurgical compounds including oxides, eutectics, and intermetallics, are of controlled compositions, concentration profiles, and electronic or other optoelectromagnetic properties. In some devices, the microstructure of the compounds comprises a plurality of microscopically thin, regularly-shaped and uniformly-spaced bodies of one phase material dispersed in a matrix of another phase material. The electronic conductivities of the bodies are substantially different from that of the matrix, and the bodies all terminate at microscopic distance from the pn junction (or other interfacial rectifying barrier region), so as to confine the signal current carriers to flow mainly in only one of the phases. This achieves carriers microstreaming or microbranching effects. Described also herein are different devices including micron-size eutectic devices, dendritic devices, cellular devices, and granular devices; and their methods of manufacture. The barrier regions may be further modified by diffusion, ion implantation, selective oxidation, electrolytic etching, and surface-contouring. In addition, selected circuit elements may be embedded into these devices to achieve additional carriers movement control or to obtain special beneficial effects.

27 Claims, 12 Drawing Figures

SOLID-STATE DEVICE

CROSS-REFERENCE TO RELATED APPLICATIONS

This is a continuation-in-part of my two pending applications, Ser. Nos. 868,129 now abandoned and 802,018 filed Oct. 21, 1969 and Feb. 25, 1969, respectively the former now abandoned while the latter now U.S. Pat. No. 3,500,135.

BACKGROUND OF THE INVENTION

The invention relates to solid-state devices, and more particularly to melt-grown solid-state devices having unique structures and/or operating characteristics.

These solid-state devices include semiconductor, photoelectric, electroluminescent, laser, and many other optoelectromagnetic devices.

For simplicity, the invention is described mostly in connection with a semiconductor device having a signal-translating or modulating barrier region that comprises a pn junction. It is to be noted that other types of barrier regions, including those comprising interfacial rectifying barriers, metal-oxide junctions, or in general, any regions capable of active electronic signal translation or modulation, by means of controlled flow and interaction therein of electronic carriers in the form of electrons and holes, of input optoelectromagnetic signal of a prescribed kind into the desired, translated or modulated, output signal. Active signal translation is typified by the action of semiconducting diodes and transistors, in sharp contrast to those of such passive components as resistors, capacitors, and inductances.

The semiconductor diode, for example, comprises the well-known pn junction that is capable of selectively and alternately allowing and substantially blocking the flow of electronic signal current carriers in accordance with the type of the signal applied thereto for translation. Specifically and as an example, electronic current flows easily under forward bias, but is substantially blocked under reverse bias, the conductance differing by over $10^3$ times in the two states.

The material or materials making up the barrier region will be hereinafter called (solid-state) device materials. These include not only semiconductor, photoelectric, thermoelectric, electroluminescent, . . . substances; but also dopants; carriers life-time controllers, carriers flow path controllers; and eutectic or dendritic-forming or modifying substances for eutectic, cellular, granular, or dendritic devices. In addition, these device materials also include such substances as those that improve the characteristics of the barrier region in operation or during manufacture. For example, substances that enhance selective diffusion, oxidation, etching, or shaping of the barrier region are also considered as "device materials." On the other hand, the device materials do not include the substances for resistors, capacitors, inductances, and contacts, which are not an essential part of the signal-translating barrier region.

Existing solid-state device requires fairly complicated and expensive processing procedures to manufacture. The first step in a typical device manufacture is to grow a single crystal from a seed, by the Czochralski method as described by, for example, Clarke and Tomono in their patents (U.S. Pat. Nos. 2,778,198 and 3,192,082). Both ends of the resultant crystal are discarded and only the central portion of the crystal is sliced into thin wafers, which are then carefully ground and polished. Next come such critical steps as cleaning, diffusion, oxidation, rediffusion, plating, chemical etching, and metallization, . . . , with numerous tests sandwiched in between. The finished wafer, if good, is then diced into chips to be mounted, contacted, and canned. It is no wonder that the yield is often low, not infrequently zero in cases of large-scale, integrated circuitries.

In addition, the existing devices, even in integrated circuits, are relatively bulky and heavy, and consume much power to operate. Further, they are often slow in responses because of their large sizes; expensive in costs; and unreliable in operations.

An important source of unreliability arises from the thermal failure mechanism that occurs in many solid-state devices and all semiconductor devices, but particularly in integrated circuits because of the relatively small elements, complexity, close spacings, and multiple layers of metallization often used. This mechanism is typified by the secondary breakdown of a transistor due to a regenerative thermal rise in its barrier region during high-power dissipation. Any transistor can be considered as made up of a large number of one-dimensional small transistor segments in parallel. As long as these transistor segments are identical and changing temperature together under high power conditions, they will continue to share the power and current equally. However, this is not the case in real device structures. Consequently, small differences in temperature will occur in some segments leading to unequal generation of heat.

At some level of power inequity among the small transistor segments, one segment will reach a temperature at which a small additional rise in temperature increases its share of the current, which (at a constant applied voltage) in turn increases its share of the power, raising the temperature still more and regeneratively running away. Internal transistor temperatures over several hundred degrees above ambient can develop, leading to severe doping changes by diffusion, phase transformations, or alloying of metal contacts, and subsequent catastrophic failures. This situation is particularly serious in high-power, high-frequency transistors wherein the thermally generated currents injected into the base layers may stimulate further emission currents thereby triggering rapid, secondary breakdown failures.

SUMMARY OF THE INVENTION

In summary, the solid-state devices and circuitries of this invention have signal-translating, barrier regions comprising metallurgical compounds such as oxides, eutectics, and intermetallics of substantially constant stoichiometric compositions. In some devices, the microstructure of the compounds comprisesa plurality of microscopically thin bodies of one phase dispersed in a matrix of another. The electronic conductivity of the bodies is substantially different from that of the matrix, and the bodies are shaped, sized, spaced, oriented, and positioned with respect to the pn junction so as to confine the flow of carriers mainly into microscopically thin streams, thereby improving device uniformity and reliability. Also described are the structures and methods for manufacture of such devices as micron-sized eutectic devices, dendritic devices, cellular devices, and granular devices.

Accordingly, an important object of the invention is to achieve solid-state devices having improved operating characteristics.

A further object is to achieve solid-state devices which are smaller in sizes, lighter in weights, faster in responses, lower in costs and power consumptions, and more reliable in operations than conventional devices.

Yet another object is to make, by controlled melt freezing or otherwise, solid-state devices having barrier regions of controlled shapes, compositions, concentration profiles, and electrical or other properties.

Yet another object is to make solid-state devices that are responsive to external magnetic fields.

A still another object is to obtain new devices displaying the microstreaming or microbranching type of carriers flow characteristics that avoid many types of thermal failures.

Another object is to obtain novel, self-insulated, optoelectrical devices, including complementary diodes, laser arrays, self-aligned miniature light-emitters and collectors or light-emitters and phototransistors, optoelectrical logic and memory devices, and black-and-white or multi-color, flat television panels.

Further objects and advantages of my invention will appear as the specification proceeds.

DESCRIPTION OF THE DRAWING

To illustrate the invention, there is shown in the drawing the forms which are presently preferred. It is understood, however, that this invention is not necessarily limited to the precise arrangements and instrumentalities here shown.

DESCRIPTION OF THE PREFERRED EMBODIMENTS

The solute concentration profile (i.e., $c_s$ vs $P_s$) in the crystal grown from the Czochralski technique by, for example, Clarke and Tomono (See U.S. Pat. Nos. 2,778,198 and 3,192,082) can be calculated. If one assume normal freezing (perfect liquid mixing and no solid diffusion) and linear liquidus and solidus lines, thereby giving a constant segregation or distribution coefficient $k$, then Pfann's equation (*Zone Melting*, Wiley, N.Y., 1958) applies and $$c_s = k\, c_o\, (1-p_s)^{k-1}$$

where $p_s$ is the proportion solidified and $c_o$ is the initial melt concentration. This equation has given excellent results in many semiconductor applications. Values of $k$ for B, A1, Ga, In, T1, P, As, Sb, Bi, Sn, Cu, Ag, Au (in order of decreasing values) in Ge or Si are given (*Trans. Technology*, Biondi, Vol. III, D.van Nostrand, N.J., 1958, p6).

However, for large freezing ranges (e.g., down to the eutectic temperatures), curved liquidus and solidus lines must be dealt with and $k$ is no longer constant. Techniques for computing $c_s$ under normal freezing conditions but with variable $k$ are available. Gulliver as early as 1922 (*Metallic Alloys*, Charles Griffin, London, pp391–425), for example, developed a simple, combined graphic and finite-difference method; while close-form equations for quadratic, cubic, or higher-degree liquidus and solidus lines have also been given (Li, Brit. J. Appl. Phys. 18, 359, 1967; J. Appl. Phys. 39, 2094, 1968).

If freezing does not occur slowly, the melt mixing is generally not perfect and normal freezing is no longer exactly true. The advancing solid then rejects solute more rapidly than it can diffuse away into the main body of the liquid melt. An enriched layer then builds up ahead of the solid-liquid interface. The solute concentration in this layer, rather than that in the main body of the liquid, now determines the concentration of the freezing solid.

Figure 1:
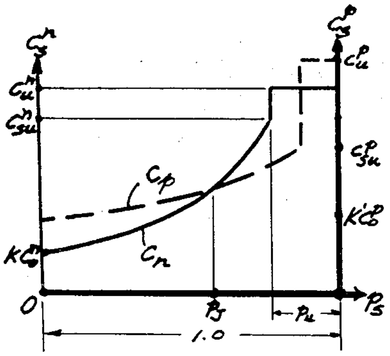
FIG. 1 shows the general concentration profiles of melt-grown crystals and the technique of producing pn junctions in these crystals by employing melt-segregating dopants of both types in controlled amounts.

Whether the freezing is normal or not, and whether $k$ is constant or not, the final crystal has a general concentration profile as shown in FIG. 1. In this figure, the donor concentration, for *Sb*, for example ($k_{Sb}$=0.003) as shown in solid line $c_n$, is initially (i.e., $p_s$=0) $kc_o^{Sb}$, but rises continuously with increasing proportion frozen $p_s$ until after $p_s=1-p_u$, when the solid concentration remains constant at $c_u$, the eutectic composition. $P_u$ is the proportion of eutectic formed as the last-freezing portion of the crystal. For another dopant, e.g., p-type Al ($k_{Al}$=0.1), the solute concentration profile is shown by the dotted, less steeply rising, line $c_p$ in the same figure. Where $c_p=c_n$, a pn junction is formed at $p_s=p_J$. For the system Al-Sb in Ge, the Pfann's equation gives:

$$c_p=0.1\, c_o^{Al}(1-P_J)^{-0.9}=c_n=0.003\, c_o^{Sb}(1-P_J)^{-0.997};$$

Hence, $p_J = 1 - 2.0\times10^{-16}\,(c_o^{Sb}/c_o^{Al})^{10.3}$.

The value of $p_J$, i.e., the fraction solidified at the pn junction, must lie between 0 and 1.0. Hence, $c_o^{Sb}/c_o^{Al}$ must lie between 0 and 33.33. If then, $c_o^{Sb}$ in the melt is 1 ppm (e.g., 0.1 mg of Sb in 100 g of Ge), while $c_o^{Al}$ is 0.1 ppm, then $p_J=3.982\times10^{-6}$. That is, if the crystal is 10.0 cm long, then the junction is located at 0.398 microns from the seed end. If, in the above case, $c_o^{Sb}$ in the original melt is only 3.21 ppm instead of 1 ppm, then $p_J$=0.327; and the pn junction in a 100-micron, melted thin layer is now at 32.7 microns from the substrate on which the crystal nucleates.

In an alloy system having a phase diagram of the eutectic type, the last portion to freeze must be a eutectic of substantially constant composition $c_u$ and melting temperature $T_u$, no matter how small $c_o$ is. That is, one always gets eutectics, in the end portion of the crystal, between dendrites, or in the boundary regions between cells or grains. This has been indicated by Hayes and Chipman in 1939 (*Trans. AIME* 135, 85). I have mathematically and intuitively proved the same (DOD Rpt. AD 805,422, Jan. 1967, pp8–9). As mentioned earlier, the amount of eutectic $p_u$ under normal freezing conditions can be determined by means of Gulliver's method or Li's equations.

As is well known to persons skilled in the art, a eutectic generally has two different phases, i.e., a plurality of phase bodies in the form of microscopic globules, rods, or sheets of a first phase material embedded or dispersed in a matrix of the second-phase material. By "microscopic", I mean fractional micron to about 15 microns in thickness. This second-phase material may, for example, be a relatively pure (semiconductor) device material, while the first-phase material may be a dopant in the original melt, or vice versa. Further, when these phase bodies occur as elongated rods or sheets, they are generally oriented parallel to the direction of eutectic growth. In addition, under proper growth conditions, these rods or sheets may be dispersed in substantially perfect, microscopically uniform and geometrically regular patterns, e.g., in triangular or hexagonal arrangements or having equal thicknesses and spacings, respectively for the eutectic rods and sheets.

The eutectics produced in alloy systems containing more than two constituents are complicated by the relatively unknown but unique paths of freezing according to the liquidus and solidus surfaces. Yet this complication is not apparent in the microstructure, which is indistinguishable from that of the binary systems.

In a properly designed eutectic of this invention, the phase bodies are electronically substantially more conductive (i.e., by over one or two orders of magnitude) to the electronic signal current than the matrix phase (or vice versa in some devices). Yet, the phase bodies are physically separated and spread out in the matrix material. For example, a low conductivity matrix material, particularly one having a temperature-resistivity characteristics different from that of the phase bodies, is very little, if at all, heated by ohmic heating (current squared over resistance) but actually isolates and dissipates the heat of a hot phase body embedded therein. Further, the microscopically thin cross-section of the phase body always possesses very large surface-to-volume ratio for very effective heat removal. On the other hand, in the conventional device, heat in any hot spot is not easily dissipated, not only because the hot spot tends to have a spherical shape with minimum surface-to-volume ratio, but also because it is surrounded by neighboring, simultaneously and also ohmically heated material of similar temperature-resistivity characteristics. In addition, any heat in the hot spot instantaneously heats up the neighboring, similar material, a condition particularly critical in pulse-operated devices. Hence, service conditions often exist which will trigger thermal run-away in conventional devices, but not in microstreamed devices.

The flow of (minority and/or majority) current carriers in these microstreamed devices is thus highly regulated, so that either the flux density of the carriers varies periodically in a predetermined manner, with a microscopic period of fractional microns to about 20 microns along a direction transversely of the flow direction; or the carriers are confined to flow mainly (i.e., over 80 percent in the phase bodies (or matrix material) as microscopically thin (i.e., micron-sized) shunting streams. This new structure, having a new mode of operation, yields radically improved results.

Such improved results include device uniformity, reliability, and reproducibility. Specifically, these microstreamed devices ensure uniform carrier current flows therein, and reduce or avoid hot spots and under- or over-currents in localized areas. This is in contrast to the ordinary solid-state devices during the operation of which hot spots often form, as previously described, to locally increase the temperature, conductivity, and current, thereby causing further increases in these parameters and resulting in device failures Eutectic manufacturing procedures have been given by Kraft (U.S. Pat. No. 3,124,452), Weiss (U.S. Pat. Nos. 3,226,225 and 3,267,405), Lemkey (U.S. Pat. Nos. 3,434,827), Heimke (U.S. Pat. No. 3,434,892), and Müller (U.S. Pat. No. 442,823). In particular, Kraft and Weiss have taught the exact conditions for producing eutectics of the required forms or morphologies, for uses as structural materials and as passive, junctionless though ambient-sensitive resistors, respectively. Normal freezing and zone melting are particularly recommended for single crystal and eutectic growth (Weiss). Pfann (ibid) has developed equipment for handling melts weighing from milligrams or less to several tons. For critical growth parameters such as growth rate and temperature gradient in the melt, see Pfann. Tiller (in Cahn: *Physical Metallurgy*, North-Holland, Amsterdam, 1965), and many others. Kraft's method (U.S. Pat. No. 3,124,452), for example, comprises unidirectionally moving a planar solid-liquid interface in a direction normal to this interface by, e.g., the zone-melting technique of Pfann. The ratio of the growth rate V to liquid temperature gradient G is to be controlled within the range of 0.1 to 1000, and preferably between 1° and 300°C/cm²/hr (Column 10, lines 49–51).

Oriented and anisotropic, melt-grown inclusions have also been obtained by Weiss (U.S. Pat. No. 3,226,225) with the following eutectic melts: InSb-Sb, GaSB-Sb, InSB-NiSb, InSb-MnSb, InSb-$CrSb_2$, InSb-$FeSb_2$, Ge-Ni, Ge-Mn,Ge-Fe, and Ge-Co (Column 3, lines 66–70). One may use these oriented eutectics as the starting materials, to be subjected to the various manipulative operations to be described, so as to make the many novel active devices of this invention. One can also start with melts of the eutectic systems of Ge with Ag, Al, Au, Bi, Ga, In, Pb, Sb, Sn, Tl, and Zn; or of Si with Ag, Al, Au, Be, Ga, In, Sb, and Sn (See Hansen: *Constitution of Binary Alloys*, McGraw Hill, New York 1958). The eutectics from these melts contain microscopic, metallic phase bodies which, being in intimate contact with the semiconductor Ge or Si bodies, are ideal for uses as highly regulated, multiple ohmic or metal-semiconductor barriers. From the melts of the eutectic systems of Ge with As, Cu, Mg, Te, and Zr; or of Si with As, Ca, Ce, Co, Cr, Cu, Fe, Mg, Mn, Mo, Nb, Ni, Pd, Pt, Ta, Ti, U, V, W, and Zr (Hansen), on the other hand, multiple barrier regions between semiconductor and intermetallic compounds are obtainable. By controlling the electrical characteristics and geometrical configurations of the barriers, and providing suitable biasing means, many eutectic devices of this inveniton are produced.

Using the same eutectic growth procedures of Weiss, Kraft, and many others, one can obtain, in an analogous manner, oriented and anisotropic, melt-grown inclusions from the above eutectic systems. As a specific example, a Ge-Al melt of exactly the eutectic composition and consisting of 53.8 g of Ge (resistivity 10 ohm-cm) and 46.2 g of (99.999% pure) Al is zone melted by induction heating (15 Kw at 0.5 megacycles). The melt container is made of high-purity (1 ppm impurity) graphite in the form of a horizontal boat. This boat has a rectangular hollow space therein measuring about 1.5 cm wide × 2.5 cm deep × 12 cm long. The bottom edges and corners of the boat are rounded. The finished cyrstal will then be about 1.5 cm × 1.5 cm × 12 cm. The induction coil preferably has two fluid cooling coils on both sides to positively control the temperature gradient in the liquid melt at about 100°C/cm. The coils are passed back and forth several times to homogenize the melt composition. The final pass, lasting about 6 hours, then starts at one end of the boat and proceeds at a very steady rate of about 2 cm/hr. These conditions give a ratio G/V of 50°C/cm²/hr. The nearly 100 percent eutectic crystal consists essentially of longitudinally aligned, lamellae phase bodies embedded in a eutectic matrix. If, however, the original melt contains 60.0 g (instead of 53.8 g) of Ge, then a "proeutectic" Ge crystal or layer (about 0.76 cm long or thick) first forms, to be followed by the Ge-Al eutectic growth. The proeutectic Ge crystal or layer is useful to form electrical contact or barrier region (See, e.g., the top white layer of FIG. 2).

The eutectic crystal grown by Weiss or according to the above technique is now longitudinally mounted with dissolvable wax or cement on a jig. The mounted crystal is sliced into wafers with a diamond wheel and normal to the eutectic growth direction. The wafers are then parallel ground and lapped in a stepwise manner, with successively finer abrasives. A final mirror finish is obtained with fractional micron, diamond polishing compound. The finely polished wafers are carefully examined under an optical microscope at 30 to 1,000 times magnification to see the shape, size, and spacing of the phase bodies; and to detect any defects. To facilitate this examination, the wafer is surface-etched. Etching reagents for many metals are given in *ASM Metals Handbook* (1948) while those for Si and Ge in *Transistor Technology* (ibid). The aluminum phase bodies, for example, can be etched with a general purpose microetch for Al consisting of 0.5 vol. percent of HF (48 percent) in water, applied as a soft cotton swab for 15 seconds. Certain phase bodies may thus be selected for the manufacture of special devices of this invention, such as the one shown in FIG. 6.

Figure 2:
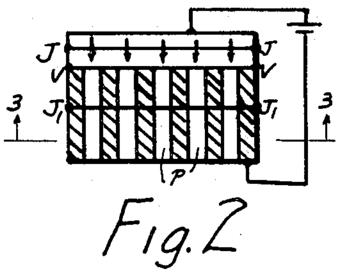
FIG. 2 is a eutectic microstreamed device in operation.

Next, the polished and inspected wafers are remounted and sliced parallel to the eutectic lamellae, to produce the devices of FIG. 2. In these devices, the top white layers (of metal or semiconductor) may be part of the proeutectic metal or Ge-crystal, or may be a vapor or chemically deposited layer, or may be a melt-grown layer. The pn junctions or barrier regions may be melt-grown inside the eutectic region (such as at $J_1$—$J_1$), or may be at the interfaces between the eutectic regions and the top layers (at V—V), or may be inside the top layers (at J—J). In melt-grown pn junctions, the method of differential segregation with, e.g., both Al and Sb dopants as described previously, may be used. The junction may also be driven into the eutectic mass by diffusion, outdiffusion, ion-implantation, or other techniques well-known in the semiconductor industry. Diffusion in nitrogen at 1,100°C with a $P_2O_5$ source, for example, gives a surface phosphorous concentration of over $2 \times 10^{22}$ atoms/cc that can readily achieve the desired drive-in effect.

In FIG. 2, the junction plane is shown to be substantially normal to the eutectic phase bodies and located within a few microns of the common terminal plane of the eutectic phase bodies. Further, the (white) phase bodies are electronically substantially more conductive then the matrix material (cross hatched). Suitable electrical contacts are made to the top and bottom surfaces of the device to forward or reverse bias the device. Vacuum-evaporated Al layers, e.g., form good ohmic contacts to both p-type Ge or Si, or n-type Ge or Si if the dopant concentration in these materials exceeds about $5 \times 10^{18}$ atoms/cc. Electroplated Cd, Cu, Au, Ag, and Zn from the cyanide solutions are rectifying on n-type Ge, but ohmic on p-type Ge. On the other hand, electroplated Sb from the fluoborate solution is ohmic on n-type Ge but rectifying on p-type Ge. The microstreams of current carriers are shown by arrows as entering the phase bodies from the top white layer.

Figure 3:
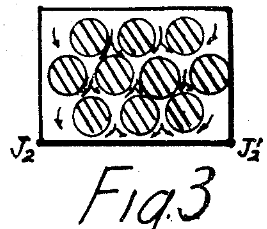
FIG. 3 is a transverse cross-section along the line 3—3 in FIG. 2.

FIG. 3 is a cross-section of the device of FIG. 2 along the line 3—3. Here, the eutectic phase bodies are globules or rods and furthermore, electronically substantially less conductive than the matrix. Hence, the signal current flows down the paper mainly (i.e., over 80 percent) in the more conductive (White) matrix. This matrix is suitably spaced so that the phase rods or globules are spaced at spacings no more than three or four times the diameters of these bodies, shown as cross hatched by the rods or globules arranged in multiple layers. The signal current is, in this device, in the form of somehwat continuous though irregularly shunting and non-parallel, but still microscopically thin, streams. The pn junction here coincides with the lower edge $J_2$—$J_2$ of the device.

Figure 4:
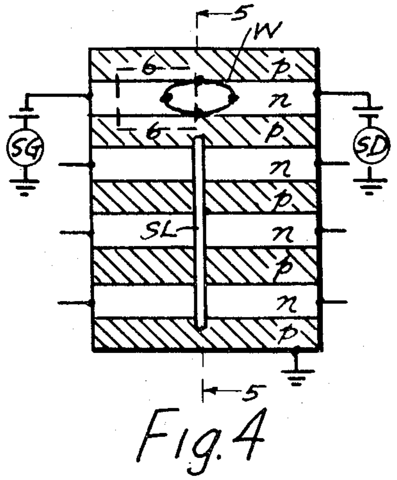
FIG. 4 shows a pair of integral, permanently-aligned, reversible or complementary, optoelectrical arrays useful as light-emitters, laser arrays, memory pads, or logical devices.

FIG. 4 shows a mass of a eutectic material provided therein with special openings. The shape, size, orientation, and surface properties of the opening may vary from one device to another. A number of conventional techniques may be used to provide the opening. These techniques include: drilling, sawing, machining, etching, laser cutting, and the like. In the lower part of the device of FIG. 4, the opening is in the form of a slot, SL oriented normally to the eutectic phase bodies (n-type) to expose the many cylindrical or lamellar pn junctions associated with these bodies. The single slot SL thus divides the eutectic mass into two optoelectrical device arrays on both sides thereof. Further, each device component on one side of the slot is exactly and permanently aligned with a corresponding component on the other side, so that these components are optically coupled with great efficiency. To further increase the coupling efficiency, the surfaces of these components may be specially contoured (See the topmost component in FIG. 4), according to a curve given by my U.S. Pat. No. 3,500,135. In addition, the light-collecting plane in the junction region of light collectors may be located optimally, together with the use of novel metallic surface reflective coatings and light shielding means on both the light emitters and collectors, as shown in the same patent.

Because the eutectic phase bodies may be only one or maybe two microns in size, separated possibly by also one or two microns of boundary layer. Hence, if propered designed, a 50 × 50 arrays of diodes may be smaller than 150 $\mu$m × 150$\mu$m, or 0.15 mm × 0.15 mm in area, which is orders of magnitude smaller than those made by conventional methods. In fact, these devices may have reached the ultimate in miniaturization, having their sizes close to or comparable to the junction region widths required for effective signal-translation.

The optically coupled diode arrays of FIG. 4 may also provide compact and inexpensive data storage and processing for computers, telephone switching, and other advanced systems. In this case, one array (left side, for example) is used as the memory or light-emitting section, each individual diode therein is selectively connected to a constant exciting (forward) voltages for light emission, so as to be turned from optically off to on, corresponding to a change in memory level from "0" to "1", respectively. The other (right) array then acts as the sensing, reading-out, or light-collecting section that senses the light status of each diode or "address" on the light-emitting or memery section.

Alternately, any one diode having a cylindrical or annular pn junction (for example, in the central cell of FIG. 9) on the sensing section may be designed, by appropriate hole or slot geometry and suitable electrical sensing circuitry, to read the "1" level when any 1, 2, 3, 4, 5, or all 6 of the surrounding diodes (or cells in FIG. 9) on the light-emitting section are emitting light at their pn junctions. Devices with planar pn junctions may be similarly designed.

Another use of the diode arrays of FIG. 4 is to extend the slot until it separates the two arrays, to reverse bias all the diodes on one array for light-collection, and to subject the array to an unknown, incoming beam of light. By feeding the radiation-transformed electrical signals each representing the light collected or sensed by a particular diode at a specific location, into a programmed digital or analog computer, an instantaneous and detailed analysis and data print-out may be had on the unknown light characteristics, such as: average light intensity, light beam size and location, light intensity distribution, light frequency or color spectra, . . .

The separated light-collecting array of FIG. 4 may be used in a different manner as follows. A single light beam from a laser or light-emitting diode is passed through two acoustoelectric crystals that are electronically controlled. The crystals deflect the beam in direct proportion to the frequency of sound waves made to pass through them. One crystal bends the light beam from left to right, the other, up or down. As a result, there are many different positions in space, corresponding to the positions on the light-collecting array, at which the beam can be aimed as it emerges from the second crystal. This solid-state system will record some characteristics of sound, e.g., the time variation of the frequency of some unknown sound, and transform the characteristics into time-serial, electrical pulses generated at the diodes of the array.

If one prepares the opposite faces of a eutectic disc on the separated, light-emitting array of FIG. 4 by carefully polishing to substantially optical flats exactly parallel to each other but normal to the (cylindrical or planar) junctions to form optically resonant cavities, applies electrical contacts to the eutectic phase bodies, and electrically grounds the eutectic matrix, a 50 × 50 laser array may be had, again also possibly within 0.15 × 0.15 $mm^2$. This laser array will controllably emit exactly oriented, perfectly parallel laser beams at prespecified positions thereon, either alternately or simultaneously, as needed. The intensity of each beam may be individually adjusted by proper control of the power or voltages applied on the diodes.

In this laser array, as in the arrays of FIG. 4, the dimension of the diodes and their spacings and geometries can be kept constant to within a small fraction of a micron. This is because eutectic microstructures are highly regular, at least over small regions. Further, the laser beams so obtained, and even the two arrays on the two sides of the slot of FIG. 4, are perfectly and permanently aligned and positioned, a very costly affair if not an impossibility with conventional techniques.

Transistor or tetrode arrays can be made from the diode arrays (of FIG. 4) by, e.g., additional diffusion, epitaxial growth, and/or ion implantation.

Each diode of the laser array described, or of the separated light-emitter array of FIG. 4, generally emits a visible or invisible light of prespecified compositions or spectra, with an intensity increasing with the forward bias applied thereon. Gallium arsenide phosphide for example, efficiently emits a bright red spectrum of 0.650 micron wave-length with only 10 ma at 1.6 volts of input power. These arrays can therefore be used to display or transmit mono-color pictures.

If, however, CdS is suitably prepared as the electroluminescent device material, then at a low forward current level (around 7.5 a/$cm^2$) blue (0.497 micron) is emitted, while at a higher current level (around 15 a/$cm^2$), green is emitted (See Yee and Condas, Solid State Electronics 11, 419, 1968). This allows multicolor picture display. Gallium phosphide diodes can even be individually doped to achieve green, yellow, or orange outputs under nearly the same bias.

The wavelength of laser emission from lead tin telluride can be tailored over a wide range, i.e., from 4.2 to 10 microns. The absorption characteristics of a fluid, either stationary or flowing in the slot of FIG. 4, can be tested based on these results. To vary the emission wavelength, one simply varies the amount of tin in the telluride; the heavier the tin concentration, the shorter the wavelength. In the device of FIG. 4, the left side of the slot forms the variably tin-doped laser array, while the right side of the slot the detector array. One may also variably dope the laser diodes in the arrays of FIG. 4 from top to bottom, while simultaneously differently surface-contouring the same arrays from front to rear (U.S. Pat. No. 3,430,109). This device allows the determination of the absorption characteristics of a stationary solid in, or a moving liquid through, the opening or slot SL, not only in regard to light beam wavelength but also in regard to beam intensity or spreading characteristics.

Figure 5:
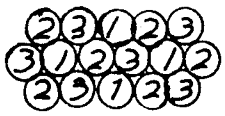
FIG. 5 shows an arrangement for the three (primary) color dots for color-picture display and transmission in connection with the light-emitting array obtainable from either side of the dividing line 5—5 in FIG. 4.
Figure 9:
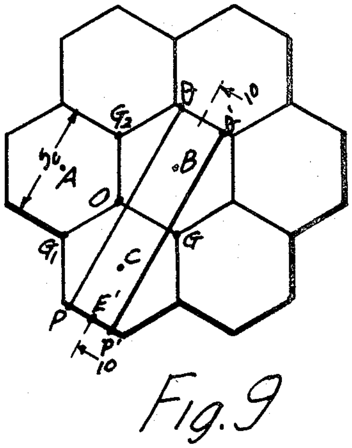
FIG. 9 is a longitudinal end view of some melt-grown cells, from which a cellular device is made.

The heat from some light beams may also be used to selectively change the color of some radiation- or heat-sensitive particles (such as liquid crystals) optically communicable, or in optical alignment, with the light beams. This also allows multi-color picture display or transmission. In particular, two or three different types of radiation-sensitive particles may be chosen, or the particles can be so selected as to respond to two or three specified levels (i.e., levels 1, 2, and 3) of light beam intensities, so as to respectively yield two or three primary colors (preferably blue, red, and yellow). In addition, the particles or light intensities are applied to specified locations, as shown in FIG. 5, where the numbers 1, 2, and 3 refer to the three light beam intensity levels or primary colors. A flat, color TV picture display device is now obtained. Alternately, the radiation-sensitive particles may be replaced by suitable color filters, to achieve the same multi-color picture display results. In two-color display devices, each eutectic phase body or cell is surrounded by six similar bodies or cells in a hexagonal pattern, as shown in FIGS. 3 and 5 or FIG. 9, respectively.

Eutectics are never completely perfect over one centimeter in length, but become disturbed, irregular and, most frequently, discontinuous from one longitudinal segment to another in a crystallographic sense. However, on a transverse section, the phase bodies are still generally highly regulated. In particular, all eutectics still have, within small regions of millimeter or less, substantially perfect eutectic structures which, upon being selected under the microscope, allow the manufacture of all my new eutectic devices. Further, the most imperfect Weiss, Kraft, or other eutectics; or the boundary eutectics between bicrystals or tricrystals; or between the cells of Kramer (Trans. AIME 227, 374, 1963), of Kraft (Trans. AIME 227, 397, 1963), and of Cooksey (Phil. Mag. 10, 745, 1964); or the boundary eutectics between the cells and dendrites of Bolling (Can. J. Phys. 34, 234, 1956); still must contain many a single, substantially perfect eutectic phase body that can be selected and isolated for the manufacture of the device of FIG. 6. Where there are a group of eutectic phase bodies in substantially perfect form, even the various devices of FIGS. 4 and 5 can be made therefrom.

Without special precautions, melt-grown germanium or silicon is invariably polycrystalline, being in the form of granular, cellular, columnar, or dendritic structures. Cast ingots, diffused coatings, and welded pieces invariably have granular, cellular or columnar, dendritic, or eutectic structures, usually having several structures in the same sample (See Chalmer: *physical Metallurgy*, Wiley, 1959, pp 234–261; and Christian: *The Theory of Transformation of Metals and Alloys*, Pergamon, 1965, pp547–582). Further, the conditions for producing each such crystalline morphology or structure is well known and predictable. By selecting and isolating suitabble grains, cells, dendrites, or eutectics, one can again easily make the many new devices of the present invention.

To facilitate making electrical contacts, the n-type eutectic matrix or phase bodies can be selectively removed by electrolytic etching. In this operation, the n-type regions are connected in parallel to form the multiple anodes, while an inert carbon or platinum cathode together with a suitable (weak, generally non-chemically etching) electrolytic bath, such as an aqueous solution of 5 volume percent each of HF and $HNO_3$, is used. The reverse-biased pn junctions will prevent the etching currents from flowing into the p-regions. This results in removal only of the n-regions, from the ends of the phase bodies inward. The p-regions thus protrude out for easy electrical contacting. A simple, economical way is to simultaneously solder, spring, alloy, or soft-metal contact the tips of all the protruded p-regions onto a selectively metallized, insulating support having conductive paths printed thereon beforehand. The metal phase bodies such as Ag, Al, Ga, In, Sn, and Zn in the metal-Ge or metal-Si eutectic mass can also be selectively etched off by common acids such as $HNO_3$, HCl, and $H_2SO_4$. On the other hand, the Si or Ge phase bodies maybe preferentially etched off relative to many nobel metals such as Au, Pt, Pd, . . . , by means of mixed HF-$HNO_3$ acids, as per conventional Ge and Si etching technology.

Figure 6:
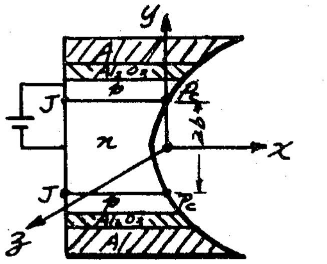
FIG. 6 shows a surface-contoured, light-emitter or collector comprising a single eutectic phase body selectively cut from the device of FIG. 4 along the line 6—6.

Each diode in either optoelectrical array of FIG. 4 may even be selected and isolated, along the line 6—6, by cutting, grinding, masking and etching, or other means. A single optoelectrical energy-transforming device is then obtained. This device comprises a single eutectic phase body of an electroluminescent or radiation-sensitive device material (such as GaAs, GaP, GaAlP, Ge, Si, . . . ). In this device (FIG. 6), the pn junction is in the form of an annular ring (in a phase rod) or two parallel stripes (in a phase sheet) melt-grown or otherwise produced inside the phase body. The Ge-Al eutectic slice or wafer has been preferentially oxidized at the interfacial surfaces between the Ge and Al phase bodies, so as to form insulating $Al_20_3$ layers around the Ge phase body, or even to form unique metal-oxide-semiconductor structures as shown in FIG. 6. The principle of prefential oxidation is to be described. In practice, one uses an oxidation temperature of 0.3 to 0.75 times the absolute melting point of Ge or Si (i.e., 97°– 652°C for Ge), in an open-end, 2-inch quartz tube with wet oxygen flowing therethrough at 5 cubic feet per minute; or in a closed quartz vessel under a partial oxygen pressure of 10–400 microns. The preferential oxidation is stopped as soon as an electrical test indicates that the Al and Ge phase bodies are substantially electrically insulated from each other. It is to be noted that in the Weiss' oriented Ge-Co., Ge-Fe, Ge-Mn eutectics, the metals all have higher heats of oxidation than Ge and are, therefore, preferentially oxidizable thereover.

The device of FIG. 6 transforms energy from one type to another, one of the types being radiation at or near the peripheral surface of the pn junction region, and the other being electrical energy at the two end or terminal planes of the same junction region. For operation as light-collector, the incoming light quanta must have energies equal to or exceeding the band width of the semiconductor material, to allow the hole-electron pairs to be formed. In this connection, it is desirable to surface-contour or differentially expand, the pn junction region peripheral surface (FIG. 6). This procedure achieves not only great expanded junction surface, but also radiation focussing effects and, in addition, resistance to surface contamination by mobile ions, submicron dust particles, or contacting surfaces (See U.S. Pat. No. 3,430,109).

Dynamic matching of, and contamination between, two ideally rigid rubbing surfaces is practically impossible. With non-rigid surfaces, however, a static and dynamic contamination of the junction region surface is possible if the radius of curvature of the junction region surface is greater than, or equal to, that of the contacting surface, particularly if the contacting surfaces are resiliently held together under compression and simultaneously rubbed together. The resiliency may come from the operator's hand, yielding container wall, momentum of liquid pressing the surfaces together during cleaning or etching, . . . In integrated circuitry work, even a single rubbing contamination on one side of a device can be very costly. A most common contaminating surface is the edge of the 10–20 mil thick semiconductor wafer or chip, on which the solid-state device is made. During the repeated cleanings, etchings, and rinsings, the device is inevitably and very frequently rubbed against these edges on neighboring devices.

As shown in my U.S. Pat. No. 3,500,135, the optimal surface contour for focussing parallel incoming radiation in an $x$–$y$ plane onto two prespecified, light-collecting points, $P_c$, at a non-negative distance $2b$ apart in the same plane should have an equation of the following form:

$$\sqrt{x^2 + y_1^2} - x = \text{constant},$$

where the $y$-axis joins the two points and the $x$-axis is normal to but bisects the straight line joining the two points, and where $y_1 = b + y$ for the portion of the curve above the $x$-axis, but $y_1 = b - y$ for the portion below the $x$-axis.

The peripheral surface of the device body including the junction region may also be surface-coated with a layer of a reflective metal such as silver and aluminum. This layer is electronically conductive outside, but non-conductive inside, the junction region, as taught in my U.S. Pat. No. 3,500,135. Further, the optoelectrical device may include light-shielding means centrally positioned to restrict the emitted or collected light rays to travel substantially radially to or from the contoured peripheral surface, thereby insuring parallelism of the emitted or reflected, outgoing rays, or achieving maximum focussing effects of the incoming rays. The light-collecting device should have light collecting $z$–$y$ plane exactly positioned inside the junction region so that the electron and hole generated by an impacting radiation particle arrive at the respective collecting, terminal planes of the junction region at exactly the same time, thereby producing a fast, pure, and strong output signal.

To make the self-insulated devices or device arrays, one can also start with a Ge-Al or Si-Al eutectic crystal grown by, for example, the zone-melting method previously described. Slice the crystal into thin wafers (less than 10 mils thick), selectively oxidize the aluminum matrix into insulating $Al_2O_3$, without deep penetration and by means of the conventional masking and diffusion techniques. The masking technique consists of coating the wafer with a thin layer of Kodak KPR or other suitable photoresist, to be exposed under ultraviolet light with mask on and later developed. Silicon can be oxidized to $SiO_2$ at 1,150°C at the rate of about 8000, 2200, and 1,800A./hour in steam, wet oxygen, and dry oxygen, respectively. Excessive $SiO_2$ can be etched off with 30 or 50% HF at the rate of 5,000 and 18,000 A./min. (at 25°C). Ge can be similarly oxidized to $GeO_2$ at 500°–800°C. Junctions in this thin wafer can be formed by the conventional masking-etching-diffusion techniques as per Ge and Si diffusion technology, Ion-implantation method can also be used for both oxidation and junction forming.

In the device of FIG. 4, the central opening or slot SL may be greatly reduced in length so as to become a cylindrical, elliptical, or other specially-contoured hole W. This hole may be machined (by drilling or laser beam) into the eutectic mass and centered on a single eutectic phase body, as shown in the topmost component of the device of FIG. 4. Here, the hole W divides the eutectic phase body into two electrically isolated bodies. A pair of integral or permanently aligned, optically coupled diodes then result. These diodes, as a unit, may be electronically isolated from the rest of the device by, e.g., device boundry oxidation previously described. These complementary diodes may also be physically isolated by cutting, grinding, etching, and laser machining along the line 6—6.

In this topmost component, the hole W is elliptical with a vertical minor axis. The rounded top and bottom sides of the hole are tangential to, or within a few microns of the junction region terminal planes, so as to greatly and differentially expand the junction region peripheral surface (See U.S. Pat. No. 3,430,109). With suitable electrical contacts, a pair of reversible or complementary, optoelectrical diodes is obtained. In the figure, the top or light-emitting diode is forward biased to emit light in response to the signal gerenator SG, while the bottom or light-collecting diode is reverse-biased so as to detect the signal, i.e., the emitted light signal from the left diode, to be shown on the signal-display system SD. The thickness of the entire phase body may be only a fraction of a micron to a few microns. The pn junction may be in the form of an annular ring or of two parallel planes at fractional micron distance aart. The exact size and position of the junction may be modified by conventional techniques such as diffusion or ion-implantation. In this particular unit, a contacting device comprising three of four insulated spring metal clips may be inserted into the hole to make all the necessary electrical contacts (at the black dots shown), simply and at very low costs. The hole may even be filled with radiation-transparent glass, epoxy, or other substantially electronically inert material to hold the contacting device in position, to prevent the junctions from some types of surface contamination, or to focus or otherwise modulate the incoming or outgoing light beams.

The germanium-aluminum eutectic is formed at the eutectic temperature of 424°C and contains 53.8 percent by weight, or 37.1 percent by volume of germanium (Hansen: *Constitution of Binary Alloys*, *McGraw Hill*, *N.Y.*, 1958). The eutectic comprises substantially pure germanium phase bodies. By "substantially pure" is meant, in this application, that the germanium bodies contain up to the saturation limit of the impurity at the respective eutectic temperature, e.g., $3.6 \times 10^{20}$ atoms/cc for the impurity Al). These phase bodies of germanium are either separated or dispersed in a second type of phase bodies consisting essentially of aluminum saturated with germanium at 424°C, i.e., about 7.2 percent by weight of germanium. Knowing the volume percent of germanium in the eutectic phase, one can compute the thickness and spacing of eutectic phase rods or sheets for any eutectic materials.

Similarly, according to Hansen's phase diagrams, germanium also forms eutectics with Ag, As, Au, Cd, Co, Cu, Fe, Mg, Mn, Ni, Sb, Te, Zn, and Zr having 31.5, 58.6, 33.0, 3.0, 84.8, 51.7, 85.4, 60.2, 66.3, 77.0, 13.4, 10.3, 7.8, and 98.3 percent by volume of the germanium phase bodies. Silicon also forms eutectics with Ag, Al, As, Au, Be, Ca, Ce, Co, Cr, Cu, Fe, Mg, Mn, Mo, Nb, Ni, Pd, Pt, Ta, Ti, U, V, W, and Zr having, respectively, 17.0, 12.9, 56.6, 33.8, 53.8, 50.0, 71.7, 85.8, 89.8, 41.4, 81.8, 52.4, 75.5, 96.7, 96.2, 69.3, 64.6, 72.5, 99.1, 86.8, 84.8, 97.9, 99.2, and 88.8 percent by volume of the silicon phase bodies.

When a metal alloyed with a reactive metal is oxidized, the reactive metal is preferentially oxidized, particularly at low partial pressure of oxygen. One way to measure reactivity is to compare the heats of oxidation at the oxidizing temperature. Thermodynamic data for high-temperature reactions can be computed from low-temperature data, or else be determined for specific cases. Using the heats of oxidation at room temperature (298°K), one sees that GeO, $GeO_2$, SiO, and $SiO_2$ have heats of oxidation of 10.8, 129, 22.2, and 217 Kcal/mol, respectively. Many oxides have much higher heats of oxidation, often even exceeding 400 Kcal/mol. Such oxides include: $Al_2O_3$, $Ce_2O_3$, $Dy_2O_3$, $Er_2O_3$, $Gd_2O_3$, $Ho_2O_3$, $La_2O_3$, $Nb_2O_3$, $Nd_2O_3$, $Pr_2O_3$, $Sm_2O_3$, $Ta_2O_5$, $Tb_2O_3$, $Ti_3O_5$, $Tm_2O_3$, $U_4O_9$, $U_3O_8$, $Y_2O_3$, and $Yb_2O_3$.

Aluminum is thus a highly reactive metal and, having a high heat of oxidation, can readily reduce most metal oxides to pure metals at elevated temperatures. If, then, the above eutectic is selectively oxidized, i.e., at a high temperature but low partial oxygen pressures, the aluminum will be oxidized into insulating $Al_2O_3$ layers that surround the semiconducting germanium globules, rods, or sheets, thereby maximizing the microstreaming effect or even achieving self-insulating structures.

It is to be noted that the boundaries between germanium and aluminum eutectic phase bodies (as well as those between dendrites and the matrices, or between cells and grains) are transition regions from one structure (e.g., diamond cubic germanium) to another (face-centered aluminum). These transition regions are, therefore, high disordered but thermodynamically highly activated toward chemical reactions including oxidation and nitridization. In particular, the boundaries constitute "high-diffusivity paths" for elements such as oxygen and nitrogen. That is, the boundaries are preferentially oxidizable.

"It is a useful rule of thumb that grain boundaries become important in diffusion-controlled reactions at temperatures less than 0.75 times the absolute melting temperature $T_m$. Below about 0.3 – 0.4 $T_m$, even diffusion along imperfections or boundaries is too slow" (Cahn: *Physical Metallurgy*, North-Holland, Amsterdam, 1965, p.381). Hence, the useful temperatures for preferential boundary oxidation or nitridization lie between 0.3 $T_m$ to 0.75 $T_m$ (preferably nearer to 0.75 $T_m$ for shortened processing time but nearer to 0.3 $T_m$ for more effective control of the preferential diffusion), i.e., from 97° to 652°C for germanium ($T_m$ = 1,233°K).

Fast (*Interaction of Metals and Gases*, Academic Press, 1965, pp32–35 and 42) and Smithells (*Metals Reference Book*, Plemm Press, 1967, p241) give the changes in Gibb's free energy, $-\Delta G$, for various metal oxidation reactions. These $-\Delta G$'s for $Al_2O_3$ at 300, 500, 1000, and 1500°K are 377.5, 362,4, 324.8, and 273.1 Kcal/Mol respectively. Corresponding values for $SiO_2$ are 190, 183, 174, and 153 respectively. Similar values for $GeO_2$ are 115.2, 106.4, 84.7, and (73) respectively. It is therefore possible to reduce the oxides of germanium and silicon by aluminum at all temperatures from 0 to 1500°K and somewhat above. A more quantitative approach, based on equilibrium constant considerations given by Fast and many others, shows that the dissociation pressures of $Al_2O_3$ (i.e., log $p_{O_2}$ =—183.2) is some 45 and 99 orders of magnitude respectively higher than those of $SiO_2$ and $GeO_2$ at 300°K. Similarly great differences in dissociation pressures exist at elevated temperatures. That is, from room to elevated temperatures, there is a very wide range of partial pressures of oxygen within which only aluminum is oxidizable and not silicon or germanium. That is, aluminum is very easily oxidized in preference to silicon and germanium under these wide oxygen partial pressure ranges.

It has been shown that "oxygen diffuses inwards along the grain boundaries, producing oxide, which may form a continuous network, particularly near the surface." (Evans: *Corrosion and Oxidation of Metals*, St. Martin's Press, 1960). Iwata (U.S. Pat. No. 3,475,661) also taught the diffusion of donor and acceptor impurities preferentially through the polycrystalline areas,- rather than the single-crystalline areas. And the boundary regions mentioned above are indeed polycrystalline areas, while the cells, grains, . . . , and eutectic phase bodies are mostly single-crystalline.

The above teachings will enable the skilled person to effectively select, for a given semiconductor material, a useful reactive metal, an effective oxidizing temperature, a practical partial oxygen pressure, to achieve the preferential oxidation results.

One may also use reactive metals in the IV A group of the periodic table to form eutectics with silicon or germanium. Such metals include Zr, Ti, and Hf, which are non-doping relative to silicon or germanium. Zr, for example, forms eutectic with germanium at 933°C and, having a heat of oxidation at 298°K of 260 Kcal/mol, is readily oxidized in preference to germanium.

It is to be particularly noted that in a two-phase melt-grown material, each phase consists essentially of a substantially pure first device material in the core portions thereof, but has progressively higher concentrations until saturated with the device material of the other phase (at the eutectic or compound formation temperature) in the portions contacting the other phase. This achieves graded concentrations at the contact zones and minimizes the physical and thermal mismatch stresses and strains between the two phases. Further, the phase bodies are stable at even up to the eutectic or compound formation temperature when they are in thermodynamic equilibrium; but also stable at low temperatures when solid diffusivities are negligible. This graded structure and chemical stability are thus completely different from those of materials made by diffusion or vacuum and chemical deposition of one device material on another, not only mechanically or chemically, but from the viewpoint of device quality, uniformity, and stability. Such graded structures, and the associated unique concentration profiles, however, can be simulated by ion-implantation techniques.

The above disclosure describes several melt-grown eutectic devices—their structures, modes of operation, and method of manufacture. But other melt-grown devices are also available. These include cellular devices, granular devices, and dendritic devices. Examples of these are given as follows.

Figure 7:
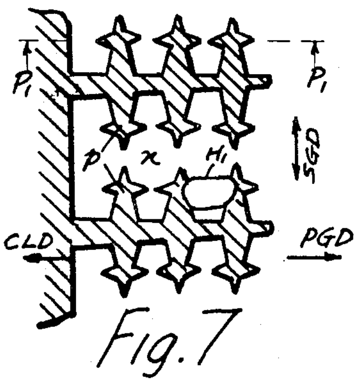
FIG. 7 shows an example of dendritic growth and some dendritic devices made therefrom.

It is well known (See Chalmers: *Physical Metallurgy*, Wiley, 1959, pp231–306) that at slow growth rates, with steep temperature gradients in the liquid, and low impurity concentrations in the melt, the solid-liquid interfaces tend to be planar under unidirectional cooling. This planarity, however, is unstable if these growth conditions change. Specifically, at the other extreme, i.e., high growth rates, small temperature gradients in the liquid, and high impurity concentration in the melt, the interfaces are very unstable, and dendrites form. This gives rise to dendritic, polycrystalline growth (FIG. 7).

Tiller has shown (Cahn: *Physical Metallurgy*, North-Holland, Amsterdam, 1965, pp406–408), both theoretically and experimentally, that "the existence of a zone of constitutional supercooling ahead of a smooth planar interface is given by the following condition:

$G/V < -m\ c(0)\ (1-k)/k\ D_1$ or $V > -kGD_1/m(1-k)\ c(0)$, where G is the temperature gradient in the liquid at the interface, $m$ the liquidus slope, and $c(0)$ the concentration in the solid at the interface." For gallium in germanium, the following values are valid: $k = 0.10$, $m = -4.4°C/at.\ \%$ (Hansen: ibid, p743). Also, $D_1 = 10^{-5}$ $cm^2/sec$ and $G = 100°C/cm$ usually. Hence, for $c(0) = 10^{-2}$, $10^{-1}$, and $10^{-0}$ at. %, if the growth velocity V exceeds 0.353, 0.0353, 0.00353cm/sec respectively, constitutional supercooling and cellular growth will result.

Tiller further shows (Cahn: ibid, pp412–413) that "as the solute concentration in the liquid, $c_o$, is increased, a point is reached when the caps of the cells project far enough into the liquid that they are unstable with respect to perturbations in a lateral direction around the cell. This condition produces the onset of side-branching and is described as the dendrite breakdown condition" Experimental data for both the cellular and dendritic breakdown are given.

Figure 8:
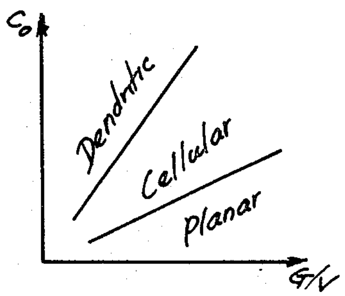
FIG. 8 shows the general relationship between growth conditions and the various types of crystal growth.

The materials, equipment, and personnel for melt growth invariably vary from one place to another. However, armed with the above teachings, the skilled person can immediately estimate the optimum growth conditions from the phase diagrams and measured or estimated $D_1$ and G. If the first growth test does not give the exact morphology desired, the teachings of this specification, and, in particular, FIG. 8, show which directions to go for correct results.

Dendrites (FIG. 7) are single or branched projections that extend into the melt. The single projections or dendritic stems generally form along the primary growth direction (PGD), opposite to the cooling direction (CLD); while the branches grow from the stems. Sometimes, small secondary, tertiary, . . branchlets may grow simultaneously from the main stems. The stems and branchlets may be microscopic in sizes. Further, as always, the last portion to freeze between the stems or branches must also be a eutectic for a eutectic alloy system.

Dendrites can be utilized much like the eutectics. For example, one can grow dendritic stems or branches of high electronic conductivity in a suitable matrix of substantially lower conductivity. The carriers then flow systematically, from the stems to the branches, to the branchlets, . . . , giving rise to a microbranchinng effect. Also, the dendritic block of FIG. 7 may be selected under a microscope, cut along the plane $P_1$–$P_1$, selectively oxidized in the matrix for complete insulation, and deposited with n-type layers thereon to make diodes or transistors. Optoelectrical complementary diodes of the type described above can also be made between the two stems or branches, as shown by contoured hole $H_1$ in FIG. 7.

According to Chalmers (*Principle of Solidification*, Wiley, N.Y., 1964), cells are favored by low $c_o$, $m$, V; but high G; and a $k$ of close to unity. Examples and teachings of cellular and dendritic growths are readily available in the literature. Bolling et al., (ibid), for example, grew crystals of zone-refined germanium of approximately 10 ohm-cm resistivity in a horizontal carbon boat using the Chalmer's technique, at growth rates of 0.16 to 0.5 cm/min. Near 0.2 at. percent of gallium, the crystal interface broke down and exhibited an array of well-developed cells. This agrees with the computed results given above in connection with Tiller's equation. With the same germanium and growth conditions but at 0.1 at. % of antimony, dendritic growth resulted.

A Ga-Ge cellular growth procedure is given as follows: 69.7 mg of (99.999 at. % pure) Ga and 36.3 g of (zone-refined, 10 ohm-cm) Ge are melted together (at 0.2 at. % of Ga) in a high-purity (1ppm impurity) graphite crucible 1 cm I.D. × 10 cm long. The melt is unidirectionally cooled,after thorough stirring (by induction currents, for example) and melt homogenization, in the longitudinal direction to freeze the melt at 0.002 cm/sec under a liquid temperature gradient of 100°C/cm. This requires about 1.17 hours to finish the cellular crystal measuring about 8.45 cm in length. An inert argon or helium gas ambient above the melt is desirable during the growth to prevent melt oxidation. For dendritic growth, everything is the same except that 60.9 mg of Sb is used instead of the 69.7 mg of Ga (so as to give 0.1 at. % of Sb in Ge). Growths of other systems in cellular or dendritic forms can be determined by theory, or a few tests guided by FIG. 8. For Al-Ge cellular growth, e.g., one simply has to change the 69.7 mg of Ga by 187 mg of Al (1.38 at. %) in the above procedure. Similarly grown Sb-Ge cells will be used as examples in the manufacture of cellular devices.

If multiple nuclei are present and scattered throughout the entire melt mass, then three-dimensional,multiple grain growth usually results. Tiny grains, preferably of close-packed, twelve-faced single crystals, are small in all three dimensions. Solid-state devices made of these grains therefore represent the smallest possible in size and weight, but fastest in speed. However, because of their small sizes, grains are inconvenient to handle and often difficult or impractical to electrically contact to. On the other hand, devices made of cells are relatively easy to handle and contact, because they generally have sizable lengths in the longitudinal direction. For ease of illustration, therefore, the following description relates mostly to semiconductor cellular devices made from germanium-antimony melts. With slight modifications, other solid-state devices of the cellular or granular types can also be made.

As a specific example,let us choose a melt of relatively intrinsic or pure germanium containing a p-type impurity (e.g., Al) that comparatively does not easily segregate on melt freezing. The same melt also has antimony as the dopant and segregating impurity. The amount of antimony is such as to form, upon cellular growth, exactly one monolayer (or ½, 2, or 5 monolayers) of the Ge-Sb eutectic at the cell boundaries, i.e., OG, $OG_1$, and $OG_2$ in FIG. 9.

Cooksey et al has shown, in Phil. Mag. 10, 1964, p755, that the cells are generally less then 100 $\mu m$ across, even in impurity cells. Most semiconductor materials are relatively pure, the cells formed therein under unidirectional cooling therefore must be even smaller. Further, "within a cell the fine two phase arrangement (spacing of the order of 1–2 μm) of the eutectic appears to grow normal to the solid/liquid interface at all points, as illustrated in their FIG. **8*b***, and elsewhere by Chadwick (1963).", and also by Kraft (ibid).

Since in cellular growth the solid/liquid profiles, or secondary growth fronts, tend to be roughly paraboloidal (Kramer, ibid), the sheet-like or rod-like phase bodies in the eutectic thus tend to start growing parallel to the (primary) growth direction coincident with the external cooling direction, i.e., along the cell axes (if the original melt is 100 percent eutectic); but bend, or tend to bend, nearly 90° thereto to intersect nearly normally to the cell boundaries, as are shown by the curved lamellae orientation line AC in Cooksey's FIG. 9. This normality relation is also clearly seen in FIG. 10 of Cooksey's. Similar reasoning applies to granular growth. The intercellular or intergranular, fine or microscopic, sheet-like or rod-like phase bodies oriented normally to the boundaries thus also provide the necessary structures to achieve microstreaming effects as described above.

For a given $c_o$ in a specific alloy system, the eutectic thickness, or number *n* of the eutectic monolayers between cells or grains formed on normal freezing, is roughly proportional to the cell or grain size ($s_c$ or $s_g$), thus:

$p_u = 1.12\ c_o^{1.03} = 1.12\times10^{-7}\ n/s_g = 1.34\times10^{-7}\ n/s_c$ for Sb in Ge, where $s_c$ and $s_g$ are in centimeters.

Tables have been prepared (Li: Phys. Stat. Solidi 15, 1966, pp51–52) showing the initial impurity concentration $c_o$ necessary to achieve a given thickness or number n of eutectic monolayers between cells or grains of specific sizes.

For example, for $c_o = 10^{-3} = 0.1$ percent by weight of Sb in Ge, and $s_c = s_g = 10^{-3}$ cm = 10 microns, $n$=12.34 and 8.224 for cellular and granular growth, respectively. That is, if the seven cells of FIG. 9 are grown from a germanium melt containing 0.1 percent antimony, and if these cells are 10 microns in sizes, then the cell boundaries OG, $OG_1$, $OG_2$ each has 12.34 monolayers, or about 40 A. of the Ge-Sb eutectic.

It is to be noted that during cellular growth, the impurities segregate not only transversely into the cell boundaries, eventually always as eutectic; but also segregate longitudinally ahead of the liquid-solid interface. This means that the effective $c_o$ of the melt, and hence $p_u$ in any transverse plane, continuously increases along the primary growth direction of cellular growth. That is, for a given cell size $s_c$, the eutectic layers at the newly-formed cell boundaries continually thicken as freezing proceeds (See FIGS. 10–11). The rate of thicknning can, however, be controlled, e.g., minimized, increased, or otherwise changed.

Figure 11:
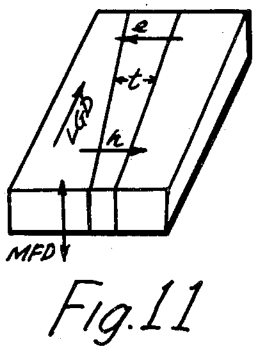
FIG. 11 is a longitudinal section of the device of FIG. 10, taken along the plane of the paper and showing a tapering barrier region sensitive to magnetic fields.

A novel device, shown in FIG. 11, can now be made as follows. This device contains two elongated bodies. Each body has a face tapering inwardly in a common longitudinal direction (LGD). The two tapering faces are made to face each other so that the distance *t* between them is monotonic increasing along the common longitudinal direction. A tapering layer forming the device barrier region is located between these two faces so as to fittingly match and join together the two tapering faces on the two bodies.

In the above device, a magnetic field may also be applied in a direction (MFD) generally parallel to the faces but normal to the common longitudinal direction, to cause the signal current carriers to interact with the field during their movements across the tapering barrier region. This produces the Hall effect, and causes the minority and majority carriers i.e. holes *h* and electrons *e*, to flow through the same region at only selected, respective portions thereof. This controllably varies the distance of carrier travel through the barrier region and, therefore, changes the device signal-translating characteristics in accordance with the applied magnetic field. It is well-known that the base layer of a transistor, which may be the tapering barrier region in this device, critically determines the transistor performances. One now has a new, magnetically coupled active device, which is particularly sensitive to the magnetic field if the signal current carriers are predominantly only of one type, say for example, electrons.

Figure 10:
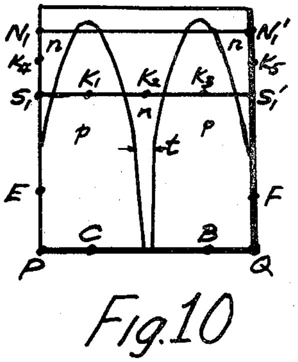
FIG. 10 is a section along the line 10—10 of FIG. 9.

Having obtained cells of the desired shapes, sizes, compositions, and boundaries, one can build many useful solid-state devices. For example, the device PP'Q'Q made from the two cells centered at B and C in FIG. 9 may be isolated by cutting, grinding, polishing, or etching; and electrically contacted at points E' and F'. This cellular device then has the cell boundary OG containing the Ge-Sb eutectic as the device material of the barrier region. Since the melt contains the relatively non-segregating p-type (Al) impurity, the bulk of the two cells will be p-type. The cell boundary OG, however, will be n-type, because of the segregating antimony, thereby forming one pn junction in the two interfacial regions between the cells and the boundary eutectic layer. This device thus represents a two-terminal pnp device (FIG. 10). In addition, this device will have some unique properties associated with the Ge-Sb eutectic barrier region material. As indicated above, the thickness of the eutectic boundary layer can be prespecified and controlled.

Useful devices can even be made of the same two cells without the relatively non-segregating p-type impurity. In this case, the resultant device will have the structure: n-type Ge/Ge-Sb eutectic/n-type Ge. The antimony in the eutectic may also be replaced by oxygen or the respective oxide so as to obtain silicon or germanium semiconductor/oxide junctions.

Alternately, by leaving the Ge-Sb eutectic around the cells B and C, one can even obtain, after proper isolating and contacting, a npnpn cellular device, shown as $N_1$–$N_1'$–$S_1'$–$S_1$ in FIG. 10.

The cells generally have paraboloidal shapes, which may be desirable. If not, the cell tips or bases can be removed (as at $S_1$–$S_1'$ or $N_1$–$N_1'$ in FIG. 10) by cutting or other methods. After the removal operations, additional electrical contacts, if needed, may be made at the tips of the cells (at $K_1$ and $K_2$). Contacts to grain boundary layers may also be made, for example, at $K_3$, $K_4$, and $K_5$ of FIG. 10.

Figure 12:
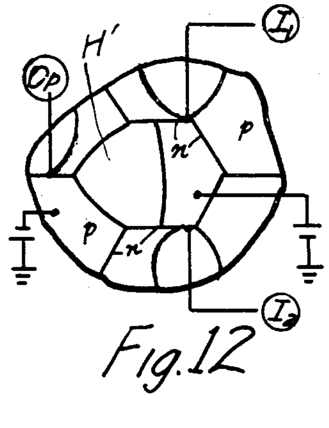
FIG. 12 is a transverse, sectional view of an optoelectric, logic device made from melt-grown cells.

FIG. 12 shows an optoelectrical logic device made from a mass of cellular material. As shown, a specially-shaped, carefully centered hole, H', is machined into the mass, and electrical contacts are properly made. The surface-contouring technique (U.S. Pat. No. 3,430,109) is used here to both expose the normally hidden boundary layers and to greatly increase the exposed area for easy contacting. In this device, the two right diodes are employed as light-emitting diodes or inputs $I_1$ and $I_2$; while the left diode as the output (Op) or light collector. The hole H' and the associated electrical circuitry can be designed so that the output diode normally is "0", but gives a signal of "1" when either one or both input diodes are optically on. One thus has an "either/or" or an "and" logic device. This device is similar in operation to the one with six input diodes as described previously in connection with FIG. 9.

In a similar manner, one can produce a rod-like eutectic mass having cylindrical pn junctions therein, and cut a thin slot (as in the device of FIG. 4) in it to form two face-to-face, optically coupled arrays, to be biased respectively as the light-emitting and collecting sections. Each diode on the collecting array is here not only faced directly with a corresponding diode on the emitting array, but also has three neighboring diodes on the opposite array. This makes another type of multichoice logic device possible.

The shapes and sizes of the cells are controllable by pre-depositing through a mask a material containing the required impurity at positions A, B, C, . . . (FIG. 9). A wide variety of impurities is possible (Li: Phys. Stat. Solidi 15, 1966, p445). These impurities include In, Ga, and Sb in Ge; and Au and SiO in Si. A single-crystalline substrate is desirable for controlled crystalline orientation. A feature of the invention is to test grow cells under identical conditions to determine the stable nuclei spacings for the chosen alloy system and growth conditions. The nuclei are then deposited at the same spacings apart to achieve great stability in the cellular growth.

The deposition stop accomplishes the following: (1) facilitating the formation of nuclei, at only the deposited spots; (2) stabilizing the cellular growth conditions if the above test-determined nuclei spacings are used; (3) defining the cell geometries (i.e., hexagonal, square, rectangular, . . . ) and location or shape of the barrier regions; and (4) achieving controlled resistivity and concentration profiles across the cells and at the cell boundaries.

Each cell has a number of boundaries, six for the hexagonal cell, for example. Some or all of these boundaries may serve as the barrier regions or contacting areas. A simple device or complicated circuitry can therefore be built with only a very few cells. This feature helps greatly in device miniaturization.

Various modifications in the design and manufacturing methods of the above basic cellular devices are readily available. These include: surface oxidation, regrowth, diffusion, ion implantation, and grain boundary diffusion. Selected wires, ribbons, sheets, spheres, ellipsoids, . . . , with or without surface insulation, may be strategically positioned in the melt during cellular growth to affect local heat transfer. They may even be purposely left in the cells to serve as conducting leads, capacitors, inductances, or other circuit elements.

After controlled growth of the cells, one can lift these cells out of the melt and shake off the excess liquid to give a "decanted" cellular structure. While still hot or partially molten, the cells may be surface-oxidized to provide insulating or passivating layers. Further, the cells may be reinserted into another melt having a different composition, or thermal, electrical, or other environments from the one from which the cells were initially grown. This procedure gives additional flexibility in processing by allowing new barrier regions having selected device materials therein to be formed, or existing layers of these device materials to be modified.

An almost infinite variety of semiconductor or other solid-state devices thus are possible from melt-grown grains or cells, eutectics or dendrites. One has a wide choice of design paramters on these devices; grain or cell geometry; size, and material; number of grains or cells, or barrier regions per device; boundary layer composition, thickness, or other properties; and contacting and passivating methods. In fact, a melt-grown device may be tailor-made to suit each and every demand or requirement.

Once the new device structures disclosed herein are given, the skilled person can readily make them, even from a single crystal of Clarke or Tomono, or a bicrystal or tri-crystal obtained readily on a Czochralski equipment. The following conventional techniques are useful in such manufactures: selection under the optical microscope at 30 to 1,000 times magnification; isolation by cutting, grinding or etching; diffusion; surface or boundary oxidation; and ion implantation. Even the unique concentration profiles of melt-grown devices can be computed or measured and then simulated, to thereby achieve simulated melt-grown eutectics, dendrites, cells, grains and, hence, the unique graded structures and stabilities. It is also possible to make many of these devices in thin-film forms, by means of vacuum, chemical deposition, or melt-flow techniques.

It is to be understood that the invention is not to be construed as limited to the particular forms disclosed herein, since these are to be regarded as illustrative rather than restrictive.

I claim:

1. A solid-state device of the type having at least one active solid-state component therein and comprising: a polycrystalline, signal-translating region in the component for actively translating optoelectromagnetic input signal by means of controlled flow therein of current carriers produced by the input signal during the translation, at least a substantial portion of the region consisting essentially of a single, non-polymeric metallurgical compound of predetermined composition and selected from the group consisting of eutectics and oxides.

2. The device of claim 1 wherein the compound consists essentially of a eutectic.

3. The device of claim 1 wherein the region comprises a eutectic consisting essentially of a substantially pure semiconductor substance and a metallic element having a heat of oxidation exceeding 400 Kcal/mol at 298°K.

4. The device of claim 1 wherein the region comprises a eutectic consisting essentialy of a substantially pure semiconductor substance and a chemical element selected from that class of elements which is preferentially oxidized over the semiconductor substance, under fractional to one full atmospheric pressure of oxygen, at temperatures between 0.3 to 0.75 $T_m$, where $T_m$ is the absolute melting temperature of the semiconductor substance.

5. The device of claim 1 wherein the region comprises a semiconducting composition characterized by a microstructure of a polycrystalline eutectic consisting essentially of two phases, one of the phases being a matrix phase and the other phase being in the form of microscopically thin phase bodies embedded in the matrix phase, the material of one of the phases being a substantially pure semiconductor substance, the material of the other phase being a substance selected from that class of substances which forms with the semiconductor substance interfacial rectifying barrier region thereby forming a multitude of interfacial rectifying barrier regions in the interfacial contact zones between the thin phase bodies and the embedding matrix phase.

6. The device of claim 1 wherein the region comprises elongated, microscopic subregions of alternately high and low electronic conductivities and locally oriented generally parallel to the flow direction of the current carriers, the high conductivity being over hundred times greater than the low conductivity so that the current carriers flow through the region in the form of microscopically thin streams.

7. The device of claim 1 wherein the region comprises a structure consisting essentially of a plurality of discrete phase bodies of one phase embedded in a multi-layer arrangement in a matrix of a second phase, the bodies having conductivity to the flow of the current carriers differing by over 10 times from that of the matrix so that the flux density of the carriers flowing through the region varies periodically along a direction transversely of the flow direction of the carriers.

8. The device of claim 1 including a material body having an outer surface, and wherein the region comprises a two-phase material integrally joined to the surface, the material comprising a plurality of substantially parallel, elongated, microscopic phase bodies of one phase dispersed according to a regular geometric pattern in a matrix of a second phase, the elongated phase bodies being all locally oriented generally normal to, and terminating within a few microns from, the surface.

9. The device of claim 1 wherein the region comprises a eutectic mass, one of the two phases of the mass being a substantially pure semiconductor substance, the eutectic phase bodies in the mass being elongated and parallel but all terminating within a few microns of one surface of the mass, and including a layer of the semiconductor substance covering the surface, the semiconductor substance in the eutectic phase being doped to an electronic conductivity type opposite to that displayed by the semiconductor substance in the layer thereby forming a multitude of pn junctions in the contact zone therebetween.

10. The device of claim 1 wherein the region comprises a layer of a eutectic selected from that class of eutectics which forms with a semiconductor substance an interfacial,electronic rectifying barrier region, and including a material body consisting essentially of the semiconductor substance, the eutectic layer covering a portion of the material body thereby forming at least one such barrier region in the interfacial zone therebetween.

11. The device of claim 10 including at least one additional material body or particle consisting also essentially of the same semiconductor substance, and wherein the eutectic layer is an interparticulate, polycrystalline layer in the form of a single, substantially continuous network integrally joining all the material bodies in a close-packed, spatial configuration and forming at least one rectifying barrier region between any two adjacent material bodies.

12. The device of claim 1 wherein the compound is a eutectic and the device comprises a mass of the eutectic matrix and a single, semiconducting,eutectic phase body at least partly embedded therein, a core portion of the phase body having an electronic conductivity of one type and an outer portion of the phase body having an electronic conductivity of the opposite type, thereby forming a diode with a pn junction in the interfacial zone between the two portions inside the phase body.

13. The device of claim 12 wherein the pn junction is radiation-exposed to the ambient and selected from that class of junctions which transforms optoelectrical energy from one type to another, one of the types being radiation at the peripheral surface of the junction and nearby zone while the other type being electrical energy at the two terminal surfaces of the junction.

14. The device of claim 12 including a wall defining a hole that separates the single eutectic phase body into two parts and divides the device into a pair of physically integral, permanently aligned and radiation-coupled diodes.

15. The device of claim 1 wherein the compound is a eutectic consisting essentially of a plurality of elongated, eutectic phase bodies dispersed in a matrix, each phase body having a pn junction therein along the length thereof, and including wall defining an opening that traverses the phase bodies so as to separate each eutectic phase body into two parts and expose two pn junctions therein, thereby forming a pair of physically integral, permanently aligned and radiation-coupled, optoelectrical diode arrays each located on one side of the opening.

16. The device of claim 1 wherein the compound consists essentially of an oxide.

17. The device of claim 1 wherein the region comprises microscopic subregions of alternately high and low electronic conductivities, the high conductivities being over ten times greater than the low conductivities.

18. The device of claim 4 wherein the element is non-doping relative to the semiconductor substance.

19. The device of claim 5 wherein the interfacial rectifying barrier regions are pn junctions.

20. The device of claim 7 wherein the flux density varies along the transverse direction with a period of microscopic length.

21. The device of claim 1 including a material body having an outer surface, and wherein the region comprises a two-phase material integrally joined to the surface, the material comprising a plurality of substantially parallel, elongated, microscopic phase bodies of one phase dispersed in a matrix of a second phase, the elongated phase bodies all extending toward and terminating within a few microns from the surface.

22. The device of claim 21 wherein the surface is generally normally of the direction of carriers flow and wherein the phase bodies have electronic conductivities differing by over ten times from that of the matrix so that the carriers flow through the region in the form of microscopically thin streams.

23. The device of claim 1 wherein the region comprises a eutectic mass, one of the two phases of the mass being a substantially pure semiconductor substance, the eutectic phase bodies in the mass being elongated and parallel but all terminating within a few microns of one surface of the mass.

24. The device of claim 23 including at least one pn junction region extending transversely across the phase bodies and located within a few microns from the one surface.

25. The device of claim 1 wherein the compound is a eutectic and the device comprises a mass of the eutectic matrix and a single, semiconducting, eutectic phase body at least partly embedded therein, a core portion of the phase body having an electronic conductivity different from that of an outer portion of the same body and forming an interfacial rectifying barrier region at the interface between the two portions inside the phase body.

26. The device of claim 25 including a material layer surrounding the phase body and electronically insulating the body from the matrix.

27. The device of claim 1 wherein the compound is a eutectic consisting essentially of a plurality of elongated, eutectic phase bodies dispersed in a matrix, each phase body having a pn junction therein along the length thereof.

* * * * *

UNITED STATES PATENT OFFICE
CERTIFICATE OF CORRECTION

Patent No. 3,765,956 Dated Oct. 16, 1973

Inventor(s) Chou H. Li

It is certified that error appears in the above-identified patent and that said Letters Patent are hereby corrected as shown below:

Column 6, line 8, "percent" should read --percent)--.

Column 6, line 43, "growth rate V to liquid temperature gradient G" should read --liquid temperature gradient G to the growth rate V--.

Column 6, line 45, "$^{o}C/cm^{2}/hr$" should read --$^{o}C\text{-}hr/cm^{2}$--.

Column 7, line 28, "$^{o}C/cm^{2}/hr$" should read --$^{o}C\text{-}hr/cm^{2}$--.

Column 14, line 27, "aart" should read --apart--.

Signed and Sealed this

*Ninth* Day of *January 1979*

[SEAL]

*Attest:*

RUTH C. MASON
*Attesting Officer*

DONALD W. BANNER
*Commissioner of Patents and Trademarks*